(12) United States Patent
Swan et al.

(10) Patent No.: US 7,112,887 B2
(45) Date of Patent: Sep. 26, 2006

(54) INTEGRATED CIRCUIT DIE AND AN ELECTRONIC ASSEMBLY HAVING A THREE-DIMENSIONAL INTERCONNECTION SCHEME

(75) Inventors: Johanna M. Swan, Scottsdale, AZ (US); Bala Natarajan, Phoenix, AZ (US); Chien Chiang, Fremont, CA (US); Greg Atwood, San Jose, CA (US); Valluri R. Rao, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/996,163

(22) Filed: Nov. 23, 2004

(65) Prior Publication Data

US 2005/0090042 A1    Apr. 28, 2005

Related U.S. Application Data

(62) Division of application No. 10/112,961, filed on Mar. 28, 2002, now Pat. No. 6,848,177.

(51) Int. Cl.
*H01L 23/48* (2006.01)
(52) U.S. Cl. ............... 257/777; 257/778; 257/E21.503; 257/E21.511; 438/108
(58) Field of Classification Search ........... 257/777, 257/778, 361, E21.511, E21.504, E21.001, 257/E21.002, E21.509, E21.499, E21.506; 438/106, 108
See application file for complete search history.

(56) References Cited

U.S. PATENT DOCUMENTS

| | | | |
|---|---|---|---|
| 3,323,198 A | 6/1967 | Shortes | |
| 3,484,341 A | 12/1969 | Devitt | |
| 3,562,009 A | 2/1971 | Cranston et al. | |
| 3,648,131 A | 3/1972 | Stuby | |
| 3,810,129 A | 5/1974 | Behman et al. | |
| 3,811,117 A | 5/1974 | Anderson, Jr. et al. | |
| 3,881,884 A | 5/1975 | Cook et al. | |
| 3,993,917 A | 11/1976 | Kalter | |
| 4,016,644 A | 4/1977 | Kurtz | |
| 4,023,562 A | 5/1977 | Hynecek et al. | |

(Continued)

FOREIGN PATENT DOCUMENTS

EP    0 698 288 B1    2/1996

(Continued)

OTHER PUBLICATIONS

Anthony, Thomas R., "Forming Feedthroughs in Laser-Drilled Holes in Semiconductor Wafers by Double-Sided Sputtering," IEEE Trans. On Comp., Hybrids, & Mfg. Tech., Mar. 1982, pp. 171-180, vol. CHMT-5, No. 1.

(Continued)

*Primary Examiner*—Brook Kebede
*Assistant Examiner*—Su C. Kim
(74) *Attorney, Agent, or Firm*—Blakely, Sokoloff, Taylor & Zafman LLP

(57) ABSTRACT

An electronic assembly is assembled by stacking two or more integrated circuit dies on top of one another. Prior to singulation, an opening is laser-drilled into an upper die, and subsequently filled with a conductive member. The conductive member is located on a lower die and interconnects integrated circuits of the upper and lower dies. Laser-drilling allows for faster throughput when compared to, for example, etching, especially if a small number of openings has to be formed. The opening is laser-drilled from an upper surface of the upper die all the way through the die, which allows for the use of alignment marks on an upper surface of the upper die.

4 Claims, 7 Drawing Sheets

U.S. PATENT DOCUMENTS

| | | | |
|---|---|---|---|
| 4,079,508 A | 3/1978 | Nunn |
| 4,089,992 A | 5/1978 | Doo et al. |
| 4,153,998 A | 5/1979 | McMurtry |
| 4,188,258 A | 2/1980 | Mounteer et al. |
| 4,205,556 A | 6/1980 | Runyan |
| 4,211,603 A | 7/1980 | Reed |
| 4,276,533 A | 6/1981 | Tominaga et al. |
| 4,291,293 A | 9/1981 | Yamada et al. |
| 4,348,253 A | 9/1982 | Subbarao et al. |
| 4,368,106 A | 1/1983 | Anthony |
| 4,394,712 A | 7/1983 | Anthony |
| 4,403,241 A | 9/1983 | Butherus et al. |
| 4,426,767 A | 1/1984 | Swanson et al. |
| 4,463,336 A | 7/1984 | Black et al. |
| 4,467,518 A | 8/1984 | Bansal et al. |
| 4,467,521 A | 8/1984 | Spooner et al. |
| 4,512,829 A | 4/1985 | Ohta et al. |
| 4,545,610 A | 10/1985 | Lakritz et al. |
| 4,603,341 A | 7/1986 | Bertin et al. |
| 4,628,174 A | 12/1986 | Anthony |
| 4,722,130 A | 2/1988 | Kimura et al. |
| 4,769,738 A | 9/1988 | Nakamura et al. |
| 4,807,021 A | 2/1989 | Okumura |
| 4,842,699 A | 6/1989 | Hua et al. |
| 4,897,708 A | 1/1990 | Clements |
| 4,954,458 A | 9/1990 | Reid |
| 4,978,639 A | 12/1990 | Hua et al. |
| 4,996,587 A | 2/1991 | Hinrichsmeyer et al. |
| 5,071,792 A | 12/1991 | VanVonno et al. |
| 5,160,987 A | 11/1992 | Pricer et al. |
| 5,166,097 A | 11/1992 | Tanielian |
| 5,191,405 A | 3/1993 | Tomita et al. |
| 5,200,810 A | 4/1993 | Wojnarowski et al. |
| 5,225,771 A | 7/1993 | Leedy |
| 5,270,261 A | 12/1993 | Bertin et al. |
| 5,307,942 A | 5/1994 | Quelfeter et al. |
| 5,309,318 A | 5/1994 | Beilstein, Jr. et al. |
| 5,313,097 A | 5/1994 | Haj-Ali-Ahmadi et al. |
| 5,314,844 A | 5/1994 | Imamura |
| 5,322,816 A | 6/1994 | Pinter |
| 5,323,035 A | 6/1994 | Leedy |
| 5,340,771 A | 8/1994 | Rostoker |
| 5,355,283 A | 10/1994 | Marrs et al. |
| 5,357,672 A | 10/1994 | Newman |
| 5,380,681 A | 1/1995 | Hsu |
| 5,399,898 A | 3/1995 | Rostoker |
| 5,414,637 A | 5/1995 | Bertin et al. |
| 5,426,566 A | 6/1995 | Beilstein, Jr. et al. |
| 5,432,677 A | 7/1995 | Mowatt et al. |
| 5,453,404 A | 9/1995 | Leedy |
| 5,463,246 A | 10/1995 | Matsunami |
| 5,466,634 A | 11/1995 | Beilstein, Jr. et al. |
| 5,467,305 A | 11/1995 | Bertin et al. |
| 5,468,663 A | 11/1995 | Bertin et al. |
| 5,468,999 A | 11/1995 | Lin et al. |
| 5,478,781 A | 12/1995 | Bertin et al. |
| 5,489,554 A | 2/1996 | Gates |
| 5,494,832 A | 2/1996 | Lehmann et al. |
| 5,502,333 A | 3/1996 | Bertin et al. |
| 5,502,667 A | 3/1996 | Bertin et al. |
| 5,502,893 A | 4/1996 | Endoh et al. |
| 5,506,753 A | 4/1996 | Bertin et al. |
| 5,517,057 A | 5/1996 | Beilstein, Jr. et al. |
| 5,517,754 A | 5/1996 | Beilstein, Jr. et al. |
| 5,532,519 A | 7/1996 | Bertin et al. |
| 5,550,942 A | 8/1996 | Sheem |
| 5,557,844 A | 9/1996 | Bhatt et al. |
| 5,561,622 A | 10/1996 | Bertin et al. |
| 5,563,086 A | 10/1996 | Bertin et al. |
| 5,567,653 A | 10/1996 | Bertin et al. |
| 5,567,654 A | 10/1996 | Beilstein, Jr. et al. |
| 5,571,754 A | 11/1996 | Bertin et al. |
| 5,596,226 A | 1/1997 | Beilstein, Jr. et al. |
| 5,615,477 A | 4/1997 | Sweitzer |
| 5,646,067 A | 7/1997 | Gaul |
| 5,654,127 A | 8/1997 | Leedy |
| 5,761,802 A | 6/1998 | Grigas |
| 5,843,844 A | 12/1998 | Miyanaga |
| 5,998,292 A | 12/1999 | Black et al. |
| 6,052,287 A | 4/2000 | Palmer et al. |
| 6,184,060 B1 | 2/2001 | Siniaguine |
| 6,223,432 B1 | 5/2001 | Dennison et al. |
| 6,260,266 B1 | 7/2001 | Tamaki |
| 6,314,641 B1 | 11/2001 | Akram |
| 6,353,189 B1 | 3/2002 | Shimada et al. |
| 6,407,341 B1 | 6/2002 | Anstrom et al. |
| 6,444,576 B1 | 9/2002 | Kong |
| 6,639,155 B1 * | 10/2003 | Bupp et al. .................. 174/260 |
| 2002/0075106 A1 * | 6/2002 | Okubora et al. ............ 333/247 |
| 2003/0155247 A1 | 8/2003 | Miura et al. |

FOREIGN PATENT DOCUMENTS

| | | |
|---|---|---|
| EP | 0 757 431 A2 | 2/1997 |
| JP | 59-15595 | 9/1984 |
| JP | 6-302954 | 10/1994 |
| WO | WO 92/03848 | 3/1992 |
| WO | WO 94/09513 | 4/1994 |
| WO | WO 94/25981 | 11/1994 |
| WO | WO 96/21943 | 7/1996 |
| WO | WO 97/45856 | 12/1997 |
| WO | WO 97/45862 | 12/1997 |

OTHER PUBLICATIONS

AZ Corporation, "Plasma Jet Etching Technology and Equipment; Silicon Wafer Thinning and Isotropical Etching at Atmospheric Pressure," Semicon/Europe, Apr. 1995, 4 pages, Geneva, Switzerland.

Christensen, C., et al., "Wafer Through-Hole Interconnections with High Vertical Wiring Densities," IEEE Trans. On Comp., Pkg. & Mfg. Tech., Dec. 1996, pp. 516-521, vol. 19, No. 4, Part A.

IPEC Precision brochure for PACEJET II (© 1996), 2 pages.

Siniaguine, Oleg, "Plasma Jet Etching at Atmospheric Pressure for Semiconductor Production," First International Symposium on Plasma Process-Induced Damage, May 13-14, 1996, Santa Clara, California, pp. 151-153.

Siniaguine, O., et al., "Plasma Processing of Silicon Wafers at Atmospheric Pressure," Electronic Industry, Jun. 1994, pp. 27-30 (not translated).

* cited by examiner

US 7,112,887 B2

INTEGRATED CIRCUIT DIE AND AN ELECTRONIC ASSEMBLY HAVING A THREE-DIMENSIONAL INTERCONNECTION SCHEME

CROSS-REFERENCE TO OTHER APPLICATIONS

This is a divisional of U.S. patent application Ser. No. 10/112,961, filed on Mar. 28, 2002 now U.S. Pat. No. 6,848,177.

BACKGROUND OF THE INVENTION

1). Field of the Invention

This invention relates to an electronic assembly of the kind having a plurality of integrated circuit dies stacked onto one another, and its manufacture.

2). Discussion of Related Art

In conventional computer assemblies, integrated circuits are "two-dimensionally" connected to one another. Two dies may, for example, be mounted to a common substrate having metal lines that interconnect the integrated circuits of the dies with one another. A "three-dimensional" interconnection scheme may in certain instances be more desirable. Handheld devices may, for example, require a more compact packaging arrangement. In other applications, the metal lines in substrates may inhibit performance. Other applications may also require a three-dimensional interconnection scheme to allow for the design of more sophisticated, three-dimensional logic.

Some techniques for forming contacts on a substrate side of a die are disclosed in U.S. Pat. No. 6,184,060. These techniques are in some respects undesirable, because they require etching of an opening in a die. Etching is relatively slow. Etching also requires many photolithographic steps. All of these factors contribute to limiting throughput.

BRIEF DESCRIPTION OF THE DRAWINGS

The invention is described by way of example with reference to the accompanying drawings, wherein.

DETAILED DESCRIPTION OF THE INVENTION

The following description relates to the construction of an electronic assembly by stacking two or more integrated circuit dies on top of one another. An opening is laser-drilled into an upper die, and subsequently filled with a conductive member. The conductive member is located on a lower die and interconnects integrated circuits of the upper and lower dies. Laser-drilling allows for faster throughput when compared to, for example, etching, especially if a smaller number of openings has to be formed. The opening is laser-drilled from an upper surface of the upper die all the way through the die, which allows for the use of alignment marks on an upper surface of the upper die.

Figure 1A:
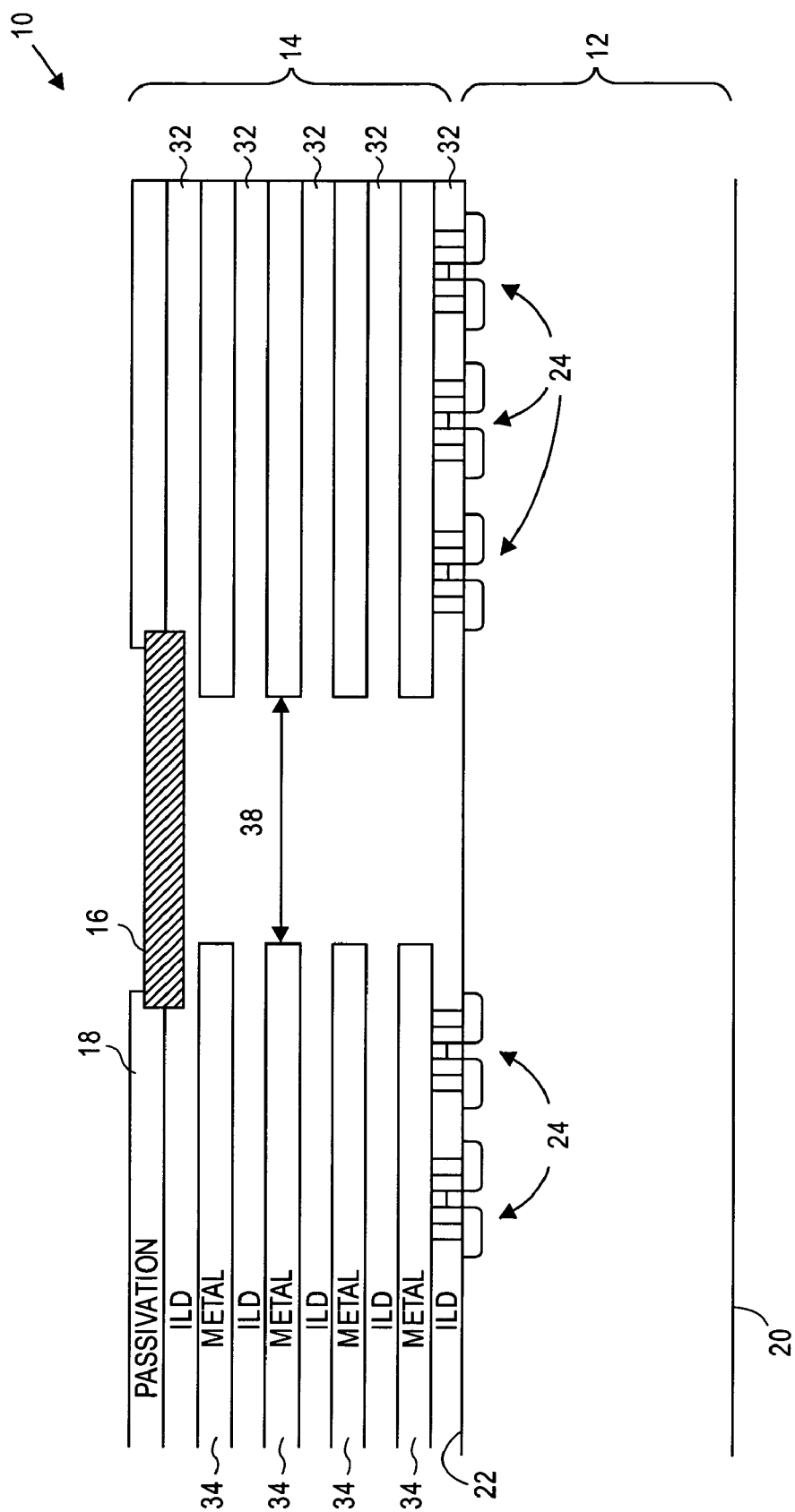
FIG. 1 is a cross-sectional side view through a wafer, illustrating a portion of a die having an opening formed in a lower part.
Figure 1B:
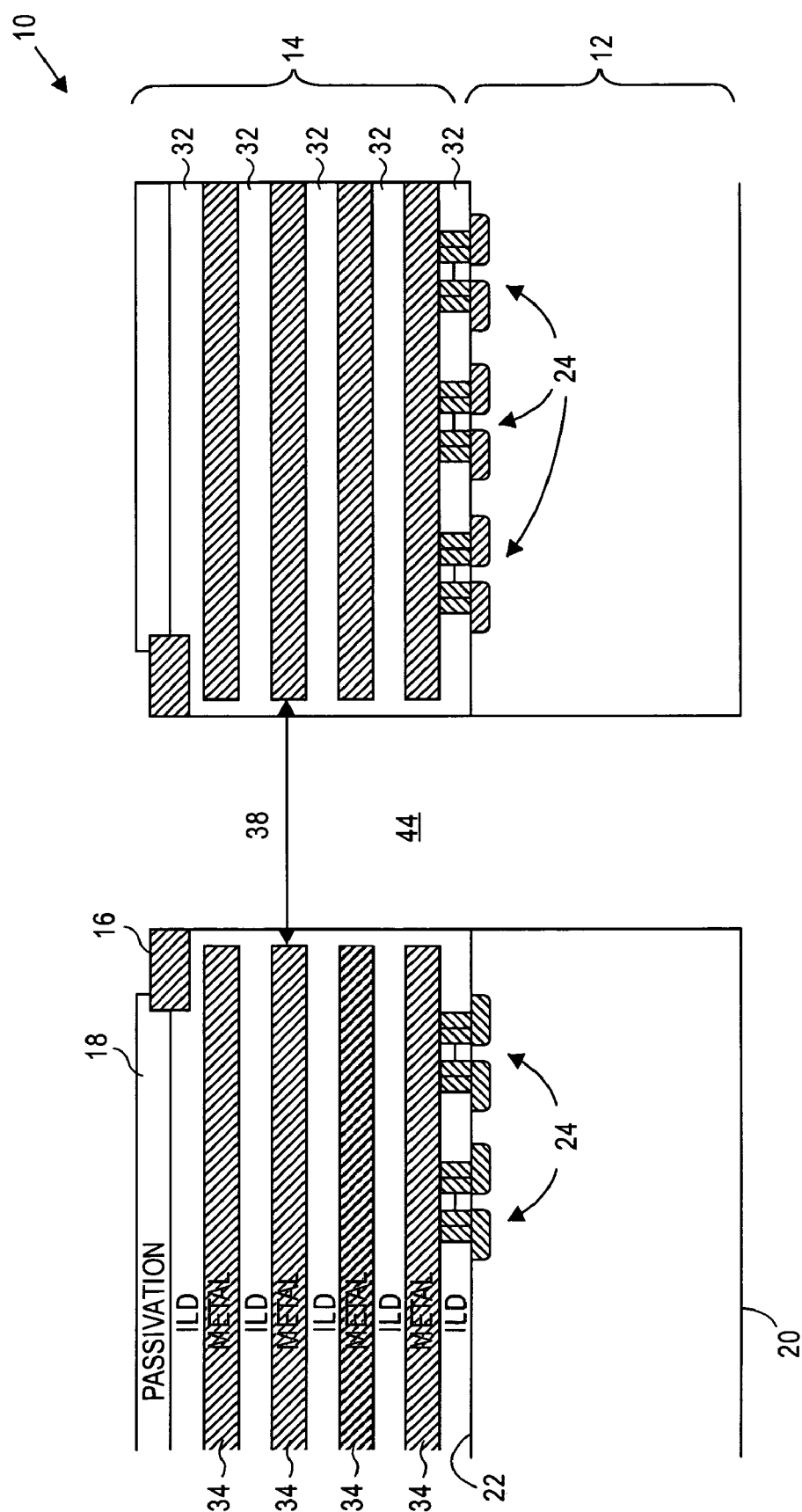

Referring now to FIG. 1, a portion of a fabricated wafer is shown, including a die 10 having a silicon substrate 12 and an integrated circuit 14 formed on the silicon substrate 12. The die 10 further includes a contact pad 16 and a passivation layer 18.

The silicon substrate 12 has a lower surface 20 and an upper surface 22. Individual transistors 24 and other electronic components are formed in and on the upper surface 22. The silicon substrate 12 is shown after having been thinned down in a grinding operation from between 425 and 750 microns to approximately 150 microns.

The integrated circuit 14 has alternating dielectric layers 32 and metallization layers 34 that are formed on top of the surface 22. The contact pad 16 and the passivation layer 18 are formed on top of the final interlayer dielectric layer 32. The passivation layer 18 has a periphery that seals with the contact pad 16 and through which an upper surface of the contact pad 16 is exposed.

The contact pad 16 is connected through portions of the metallization layers 34, plugs (not shown), and vias (not shown), to the transistors 24. Signals can thus be transmitted between the transistors 24 and the contact pad 16. The metallization layers 34 are not located in a cylindrical volume 38 below the contact pad 16. There is thus no communication between the contact pad 16 and the transistors 24 in the cylindrical volume 38.

An opening 44 is subsequently laser-drilled through the die 10. A triple-pumped Nd:YAG laser having a wavelength of 355 nm is preferably used to laser-drill the opening 44. A laser source of the laser is located above the passivation layer 18, and alignment marks on an upper surface of the die 10 is used to align the laser source with the contact pad 16. Laser light from the laser source then strikes an upper surface of the contact pad 16. The laser light ablates a central portion of the contact pad 16, followed by a central portion of the cylindrical volume 38, followed by a portion in the substrate 12. The opening 44 may be between 25 and 50 microns in diameter. In the case of a small opening such as a 25-micron opening, the opening is typically percussion-drilled. A larger opening such as a 50-micron opening may require circular movement of the laser light about a final center line of the final opening 44. Such circular motion is generally referred to in the art as "trapan" movement.

Figure 2:
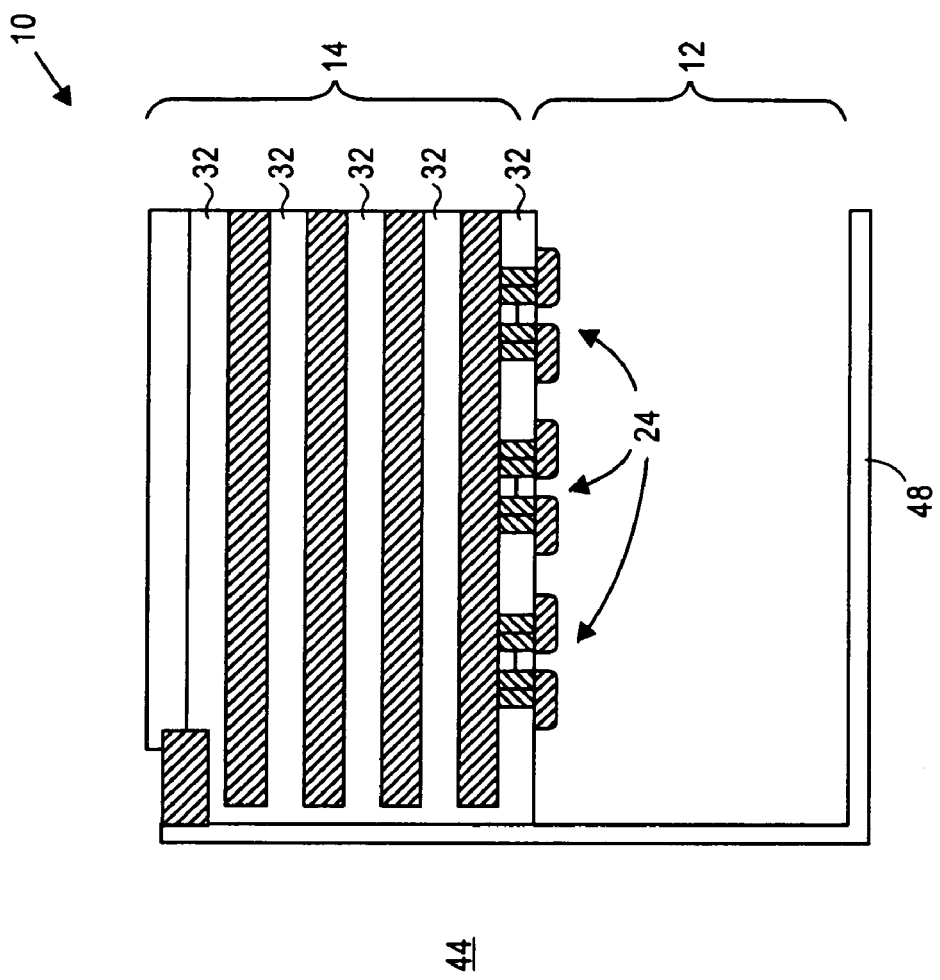
FIG. 2 is a view similar to FIG. 1 after an oxide layer is formed on a lower surface of the die and within the opening.
Figure 2:
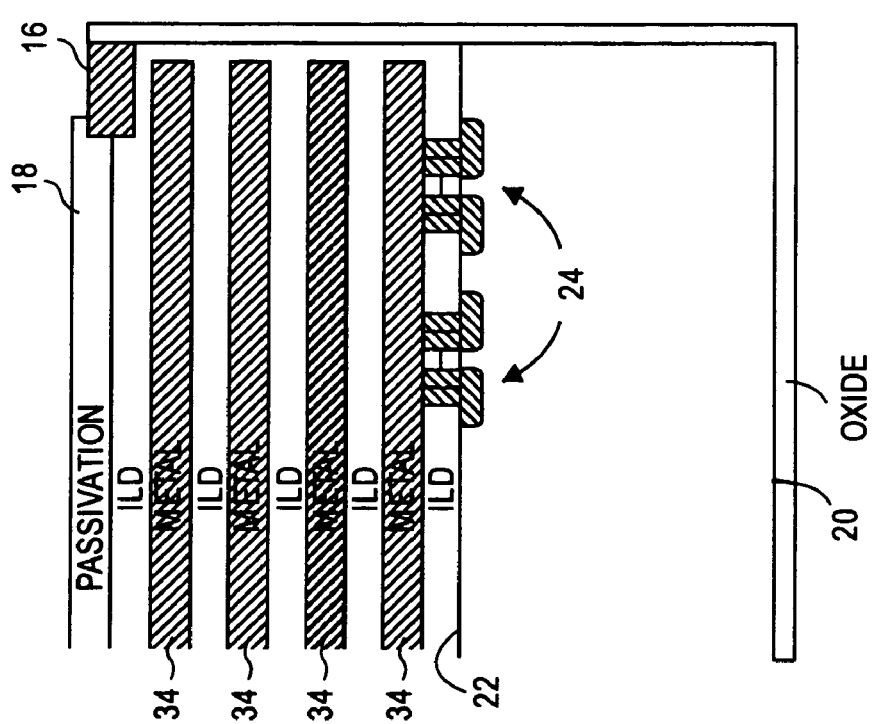

As shown in FIG. 2, an oxide layer 48 is deposited on the die 10. The oxide layer 48 is blanket-deposited so that it covers the lower surface 20 and side surfaces of the opening 44.

Figure 3:
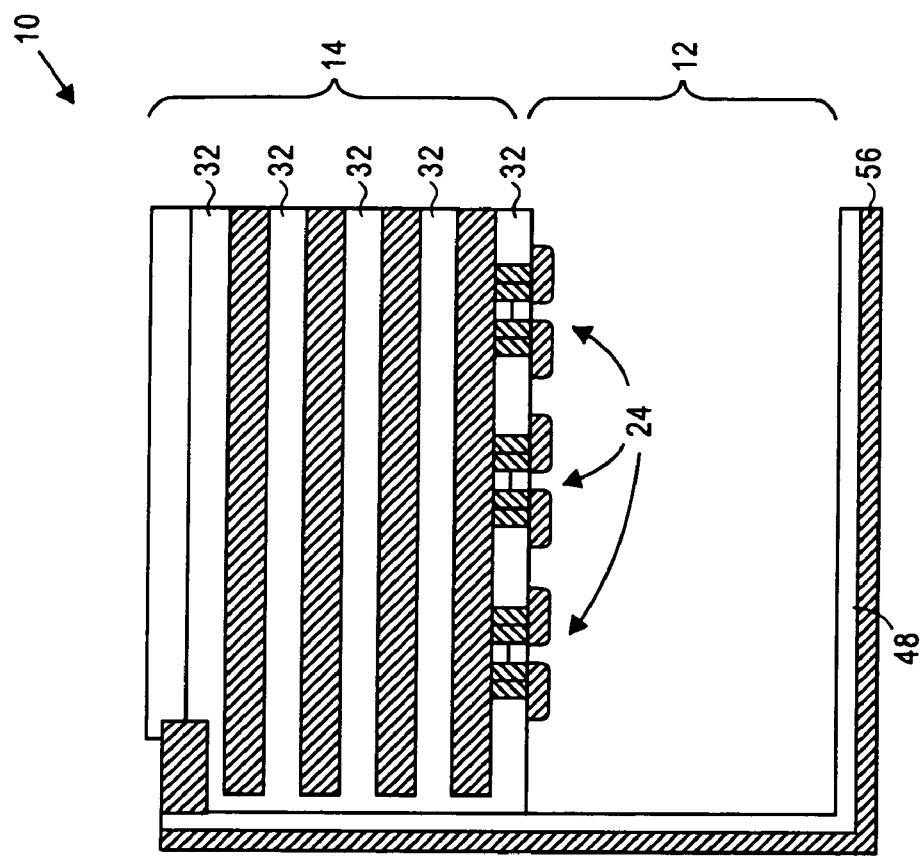
FIG. 3 is a view similar to FIG. 2 after a tantalum nitride layer is blanket-sputtered over the oxide layer and onto the metal pad.
Figure 3:
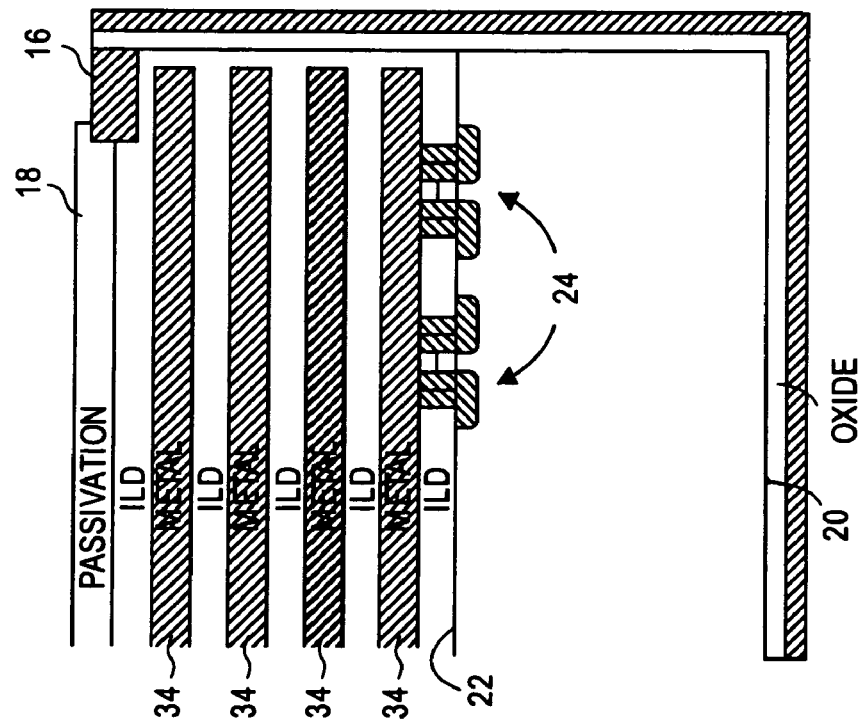

As illustrated in FIG. 3, a tantalum nitride layer 56 is subsequently blanket-deposited on the oxide layer 48. The tantalum nitride layer 56 forms on side surfaces of the opening 44 and on a lower surface of the oxide layer 48. The oxide layer 48 provides a surface onto which the tantalum nitride layer 56 can easily be sputtered, and also provides electrical insulation between the tantalum nitride layer 56 and the surrounding silicon. Techniques exist in the art for sputtering tantalum nitride on oxide within openings such as the opening 44.

Figure 4:
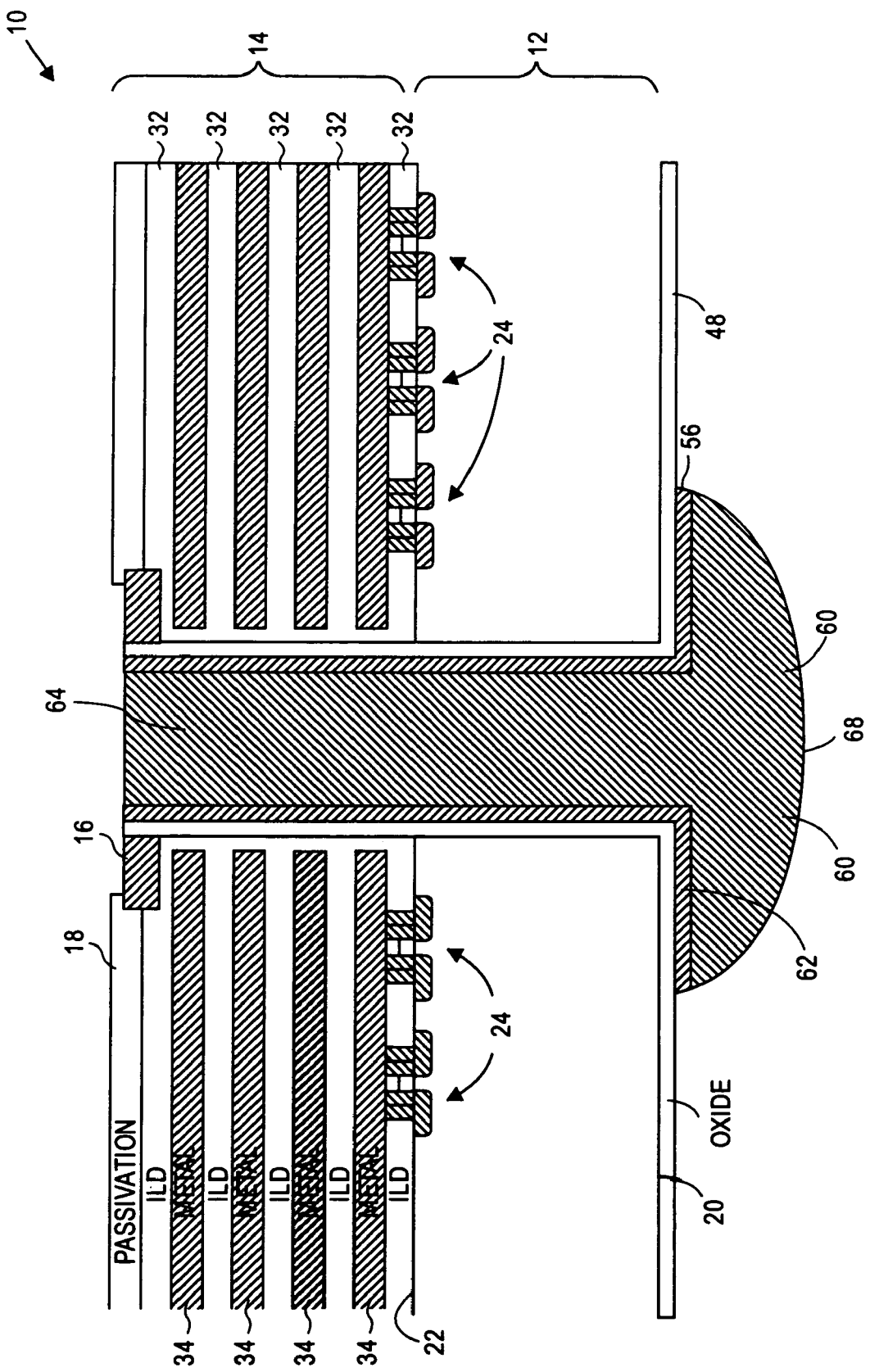
FIG. 4 is a view similar to FIG. 3, after the tantalum nitride layer is patterned and a copper conductive member is plated on the tantalum nitride layer.

FIG. 4 illustrates the structure of FIG. 3 after the tantalum nitride layer 56 is patterned and a copper conductive member 60 is formed. The tantalum nitride layer 56 is patterned by forming a mask over portions of the tantalum nitride layer 56 within the opening 44, and also over a circular portion thereof surrounding the opening 44 on a lower surface of the oxide layer 48. Other portions of the tantalum nitride layer 56 are removed, whereafter the mask is removed. The tantalum nitride layer 56 forms a circular contact pad 62 on a lower surface of the oxide layer 48.

The copper conductive member 60 is plated on the remaining tantalum nitride layer 56. The tantalum nitride layer 56 acts as a seed layer for forming the conductive member 60. Because the opening 44 extends all the way through the die 10, a plating solution can easily be introduced into the opening 44. The tantalum nitride layer 56 also acts as a barrier layer, preventing migration of copper from the conductive member 60 into the silicon of the substrate 12.

Plating is continued until the opening 44 is filled with a portion 64 of the conductive member 60 and until the conductive member 60 forms a bump 66 on the contact pad 62. The portion 64 forms a via extending all the way through the integrated circuit 14 and the substrate 12. The bump 66 has a lower surface 68 standing proud of the lower surface of the oxide layer 48. What should be noted is that the portion 64 is still electrically disconnected from the contact pad 16 and from the metallization layers 34.

Figure 5:
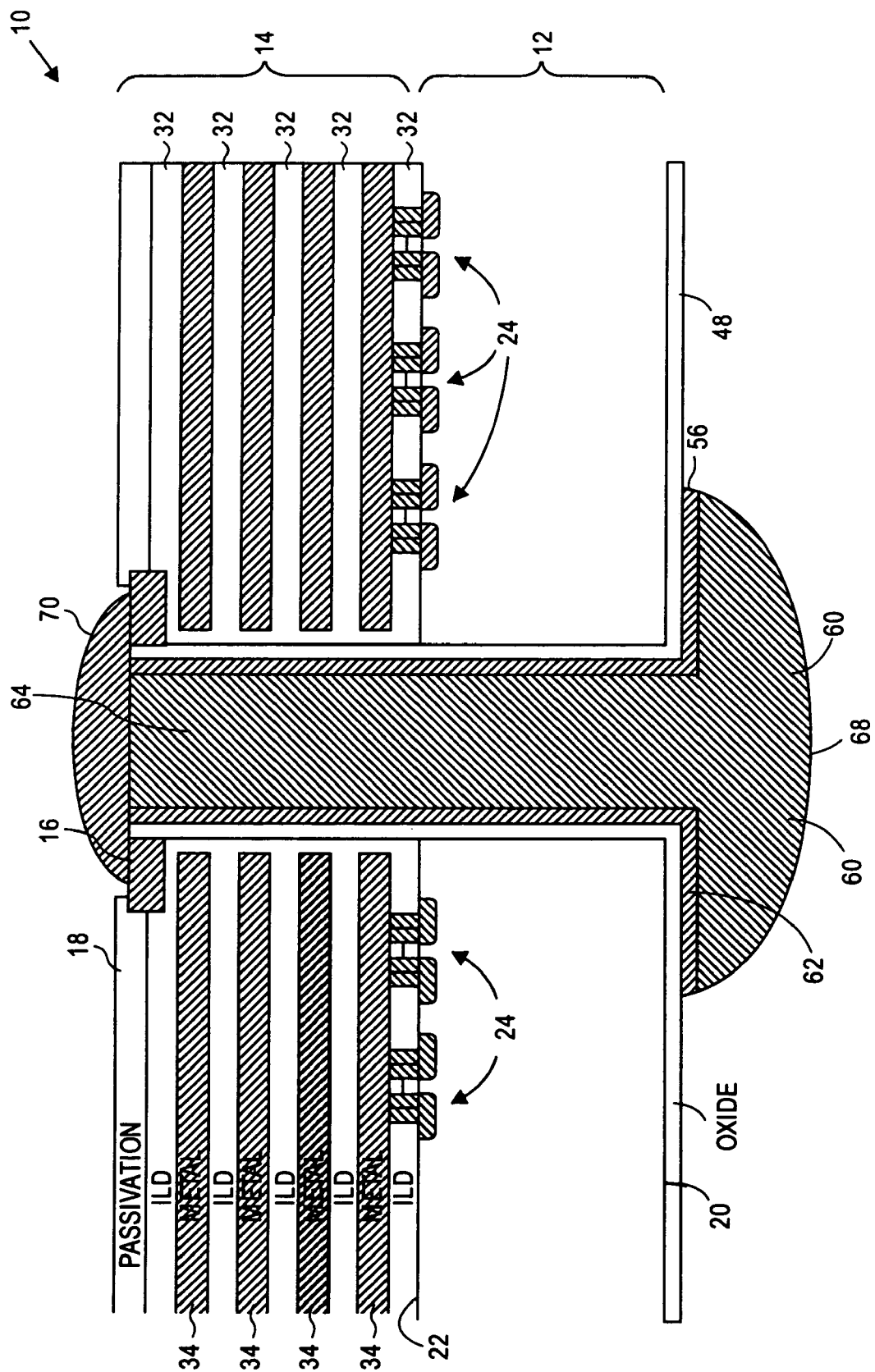
FIG. 5 is a view similar to FIG. 4 after screen-printing of a contact.

As illustrated in FIG. 5, a contact 70 is subsequently screen-printed on the die 10. A lower surface of the contact 70 has a central region that is in contact with an upper end of the portion 64 of the conductive member 60. An annular outer region of the contact 70 is in contact with the contact pad 16. The contact pad 16 is thereby electrically connected through the contact 70 to the conductive member 60. A signal can now be transmitted between the bump 66 and the contact pad 16.

Figure 6:
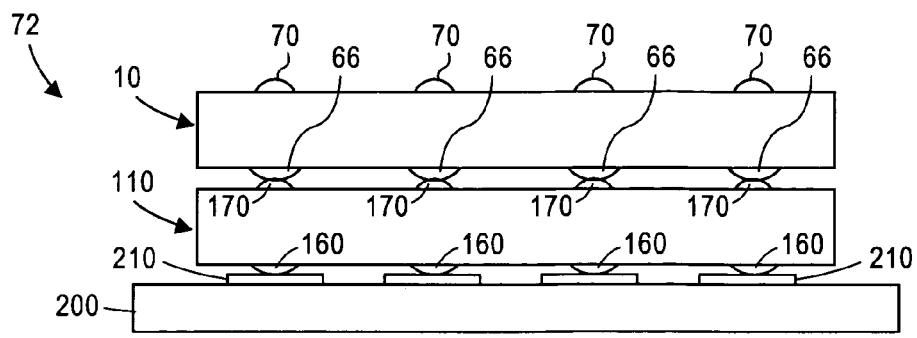
FIG. 6 is a side view of a partially fabricated electronic assembly according to an embodiment of the invention, wherein the die of FIG. 5, another die, and a package substrate are stacked on one another.

FIG. 6 illustrates a partially assembled electronic assembly 72, including the die 10. The die 10 includes a plurality of bumps 66 manufactured in a similar manner. The die 10 includes a plurality of the contact pads 16 of FIG. 5, and a respective contact 70 is plated on each one of the contact pads 16.

The electronic assembly 72 also includes another die 110 and a package substrate 200. The die 110 may be manufactured in exactly the same way as the die 10. It may also be possible that the dies 10 and 110 are exactly the same in all respects. The dies 10 and 110 may, for example, be identical memory dies. Alternatively, the dies 10 and 110 may differ from one another and may even be from different manufacturers. One die may, for example, be a processor, and the other die a memory die. What should be noted is that the die 110 also includes bumps 170 and 160 at the top and the bottom, respectively. The bumps at the top may not be necessary, and merely assist in alignment during subsequent reflow. The die 10 is stacked on the die 110, and a respective one of the bumps 66 is positioned on a respective one of the bumps 170. The package substrate 200 has a plurality of contact terminals 210 on an upper surface thereof. Each one of the bumps 160 is positioned on a respective one of the contact terminals 210.

Figure 7:
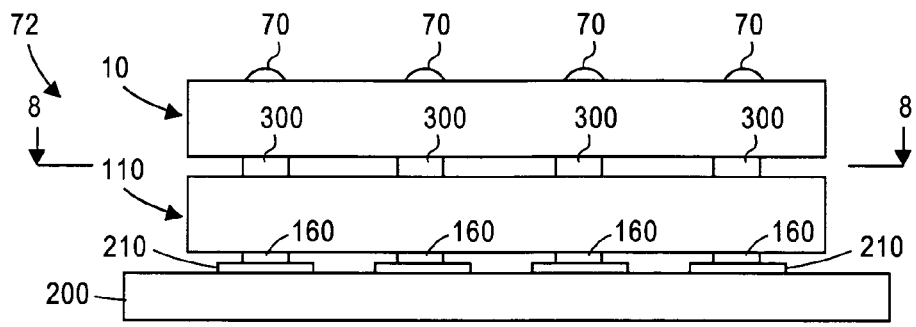
FIG. 7 is a view similar to FIG. 6 after heating and cooling of the electronic assembly.

FIG. 7 illustrates the electronic assembly 72 of FIG. 6 after being processed through a reflow furnace. The electronic assembly 72 is heated so that the bumps 66, 170, and 160 melt, and are subsequently cooled. The bumps 66 thereby attach to the bumps 170 to form interconnects 300. The interconnects 300 structurally attach the die 10 to the die 110. The interconnects 300 also electrically connect the integrated circuit of the die 10 with the integrated circuit of the die 110. Other bumps 160 attach the die 110 to the package substrate 200 and interconnect the integrated circuit of the die 110 with metallization layers in the package substrate 200.

Figure 8:
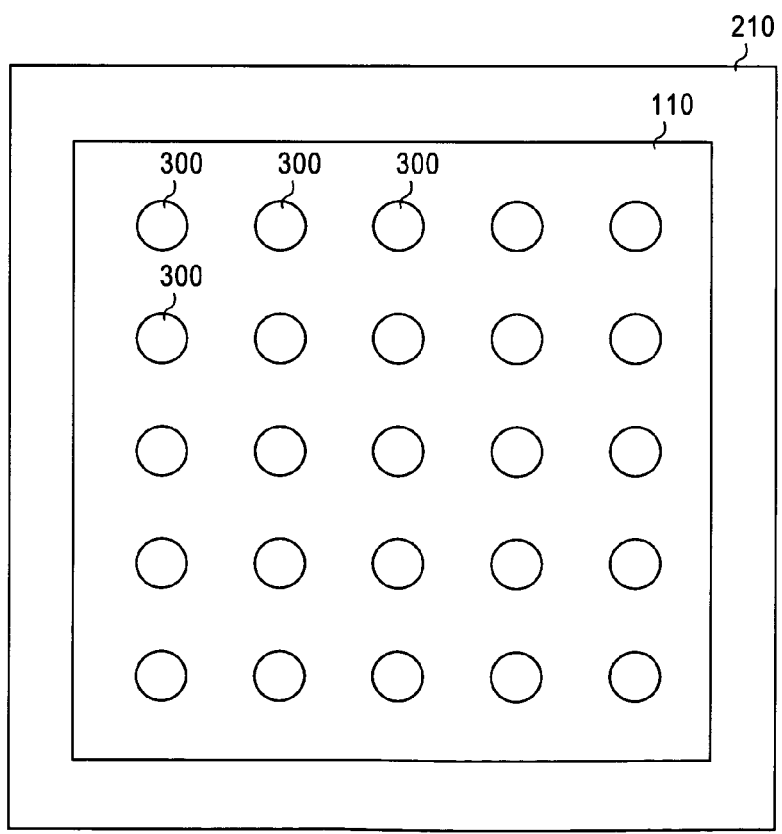
FIG. 8 is a cross-sectional plan view on 8—8 in FIG. 7.

As illustrated in FIG. 8, the interconnects 300 are in an array of rows and columns. A typical array may, for example, have ten rows and eight columns. Although only the interconnects 300 are shown in FIG. 8, it will be understood that an array of conductive members such as the conductive member 60 shown in FIG. 5 are formed in an array which corresponds to the array of the interconnects 300.

Laser-drilling of the opening 44 allows for faster throughput when compared to, for example, etching, especially if a small number of openings has to be formed. The opening 44 is laser-drilled from an upper surface of the upper die 10 all the way through the die 10, which allows for the use of alignment marks on an upper surface of the upper die 10.

An additional benefit of the electronic assembly 72 is that the die 10 provides the structural interconnection benefits of a flip-chip die, while providing the thermal benefits of a wire-bonded die. Because the integrated circuit 14 is at the top, it can be more easily cooled with a heat sink closer to the active circuitry than in a conventional flip-chip application. However, because the die 10 is structurally and electrically connected through an array of bumps 66, the structural and electrical benefits of a flip-chip application are achieved. A further advantage of having conductive members on vias in the silicon below the integrated circuit is that they are more thermally conductive than the silicon and assist in dissipation of heat.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed is:

1. An electronic assembly, comprising:
   a first substrate having a lower surface and an upper surface;
   a plurality of transistors formed on the upper surface of the first substrate;
   an integrated circuit formed above the transistors and connected to the transistors, the first substrate transistors and integrated circuit jointly forming a first die;
   a metal seed layer formed in an opening in the first substrate;
   a conductive member, of a different material than the metal seed layer, formed on the metal seed layer in the opening; and
   a second component including a second circuit, the first die being stacked on the second component and the first integrated circuit being connected through the conductive member to the second circuit.

2. The electronic assembly of claim 1, wherein the second component has a second substrate and the circuit of the second component is a second integrated circuit formed on the second substrate.

3. The electronic assembly of claim 1, further comprising:
   an oxide layer between a surface of the opening and the metal seed layer.

4. The electronic assembly of claim 1, wherein the metal seed layer includes tantalum nitride and the conductive member includes copper.

* * * * *